(12) United States Patent
Tang et al.

(10) Patent No.: US 8,555,229 B2
(45) Date of Patent: Oct. 8, 2013

(54) PARALLEL SOLVING OF LAYOUT OPTIMIZATION

(75) Inventors: Xiaoping Tang, Mohegan Lake, NY (US); Michael S. Gray, Fairfax, VT (US); Xin Yuan, Roseville, CA (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 13/151,413

(22) Filed: Jun. 2, 2011

(65) Prior Publication Data

US 2012/0311517 A1    Dec. 6, 2012

(51) Int. Cl.
*G06F 17/50*    (2006.01)

(52) U.S. Cl.
CPC ................... *G06F 17/5081* (2013.01)
USPC ........... 716/122; 716/123; 716/124; 716/131; 716/132

(58) Field of Classification Search
CPC .................................................. G06F 17/5081
USPC .......................... 716/122, 123, 124, 131, 132
See application file for complete search history.

(56) References Cited

U.S. PATENT DOCUMENTS

| | | | |
|---|---|---|---|
| 5,640,327 A * | 6/1997 | Ting | 716/121 |
| 5,712,793 A * | 1/1998 | Scepanovic et al. | 716/124 |
| 6,189,132 B1 | 2/2001 | Heng et al. | |
| 6,480,991 B1 | 11/2002 | Cho et al. | |
| 6,986,109 B2 | 1/2006 | Allen et al. | |
| 7,062,729 B2 | 6/2006 | Gray et al. | |
| 7,761,818 B2 | 7/2010 | Gray et al. | |
| 7,783,465 B2 | 8/2010 | Yang | |
| 8,205,182 B1 * | 6/2012 | Zlatanovici et al. | 716/125 |
| 2003/0005398 A1 * | 1/2003 | Cho et al. | 716/8 |
| 2005/0198601 A1 * | 9/2005 | Kuang et al. | 716/6 |
| 2009/0037850 A1 | 2/2009 | Gray et al. | |
| 2009/0125859 A1 | 5/2009 | Alpert et al. | |
| 2010/0153892 A1 | 6/2010 | Gray et al. | |
| 2010/0281448 A1 | 11/2010 | He | |
| 2010/0293127 A1 | 11/2010 | Hamadi et al. | |
| 2010/0332202 A1 | 12/2010 | Nakhla et al. | |
| 2011/0106772 A1 * | 5/2011 | Kawamura et al. | 707/687 |
| 2012/0023464 A1 * | 1/2012 | Lin et al. | 716/52 |

OTHER PUBLICATIONS

Luo et al., "Total Power Optimization Combining Placement, Sizing, and Multi-Vt Through Slack Distribution Management", IEEE, 2008, 6 pages.
Behjat et al, "A Novel Eigenvector Technique for Large Scale Combinatorial Problems in VLSI Layout", Journal of Combinatorial Optimization, 2002, Kluwer Academic Publishers, pp. 271-286.

(Continued)

*Primary Examiner* — Phallaka Kik
(74) *Attorney, Agent, or Firm* — Richard M. Kotulak; Hoffman Warnick LLC

(57) ABSTRACT

Solutions for optimizing an integrated circuit layout for implementation in an integrated circuit are disclosed. In one embodiment, a computer-implemented method is disclosed including: obtaining a plurality of hierarchical constraints in mathematical form, the plurality of hierarchical constraints defining a first integrated circuit layout; partitioning the plurality of hierarchical constraints into groups according to one or more partitioning rules; determining whether a boundary condition exists between two of the groups, and distributing a slack or a gap between the two of the groups in the case that the boundary condition exists; creating a plurality of integer linear programming problems associated with each of the groups; determining a solution for each of the plurality of integer linear programming problems; and integrating each solution together to form a second integrated circuit layout.

20 Claims, 9 Drawing Sheets

(56) References Cited

OTHER PUBLICATIONS

Fiduccia et al., "A Linear-Time Heuristic for Improving Network Partitions", 19th Design Automation Conference, IEEE, 1982.

Heng et al., "A VLSI Artwork Legalization Technique Based on a New Criterion of Minimum Layout Perturbation", ISPD 1997, Napa Valley, California, USA.

* cited by examiner

PARALLEL SOLVING OF LAYOUT OPTIMIZATION

BACKGROUND OF THE INVENTION

The subject matter disclosed herein relates to solutions for solving integrated circuit layout optimization. Specifically, aspects of the invention relate to a parallel solving approach to layout optimization.

In large-scale integrated circuit layout design, layout migration and design for manufacturability (DFM) optimization are conventionally employed. In many cases, long runtime becomes an issue in solving layout migration and DFM optimization in these large-scale layouts. Specifically, the linear programming (LP) process associated with layout migration and DFM optimization can be time consuming.

BRIEF SUMMARY OF THE INVENTION

Solutions for parallel solving of layout optimization are disclosed. In one embodiment, a computer-implemented method for optimizing an integrated circuit layout for implementation in an integrated circuit is disclosed. The method can include: obtaining a plurality of hierarchical constraints in mathematical form, the plurality of hierarchical constraints defining a first integrated circuit layout; partitioning the plurality of hierarchical constraints into groups according to one or more partitioning rules; determining whether a boundary condition exists between two of the groups, and distributing a slack or a gap between the two of the groups in the case that the boundary condition exists; creating a plurality of integer linear programming problems associated with each of the groups; determining a solution for each of the plurality of integer linear programming problems; and integrating each solution together to form a second integrated circuit layout.

A first aspect includes a computer-implemented method for optimizing an integrated circuit layout for implementation in an integrated circuit, the method including: obtaining a plurality of hierarchical constraints in mathematical form, the plurality of hierarchical constraints defining a first integrated circuit layout; partitioning the plurality of hierarchical constraints into groups according to one or more partitioning rules; determining whether a boundary condition exists between two of the groups, and distributing a slack or a gap between the two of the groups in the case that the boundary condition exists; creating a plurality of integer linear programming problems associated with each of the groups; determining a solution for each of the plurality of integer linear programming problems; and integrating each solution together to form a second integrated circuit layout.

A second aspect includes a system having: at least one computing device configured to optimize an integrated circuit layout for implementation in an integrated circuit by performing actions including: obtaining a plurality of hierarchical constraints in mathematical form, the plurality of hierarchical constraints defining a first integrated circuit layout; partitioning the plurality of hierarchical constraints into groups according to one or more partitioning rules; determining whether a boundary condition exists between two of the groups, and distributing a slack or a gap between the two of the groups in the case that the boundary condition exists; creating a plurality of integer linear programming problems associated with each of the groups; determining a solution for each of the plurality of integer linear programming problems; and integrating each solution together to form a second integrated circuit layout.

A third aspect includes a computer program comprising program code embodied in at least one computer-readable storage medium, which when executed, enables a computer system to optimize an integrated circuit layout for implementation in an integrated circuit by performing actions including: obtaining a plurality of hierarchical constraints in mathematical form, the plurality of hierarchical constraints defining a first integrated circuit layout; partitioning the plurality of hierarchical constraints into groups according to one or more partitioning rules; determining whether a boundary condition exists between two of the groups, and distributing a slack or a gap between the two of the groups in the case that the boundary condition exists; creating a plurality of integer linear programming problems associated with each of the groups; determining a solution for each of the plurality of integer linear programming problems; and integrating each solution together to form a second integrated circuit layout.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

DETAILED DESCRIPTION OF THE INVENTION

Figure 1:
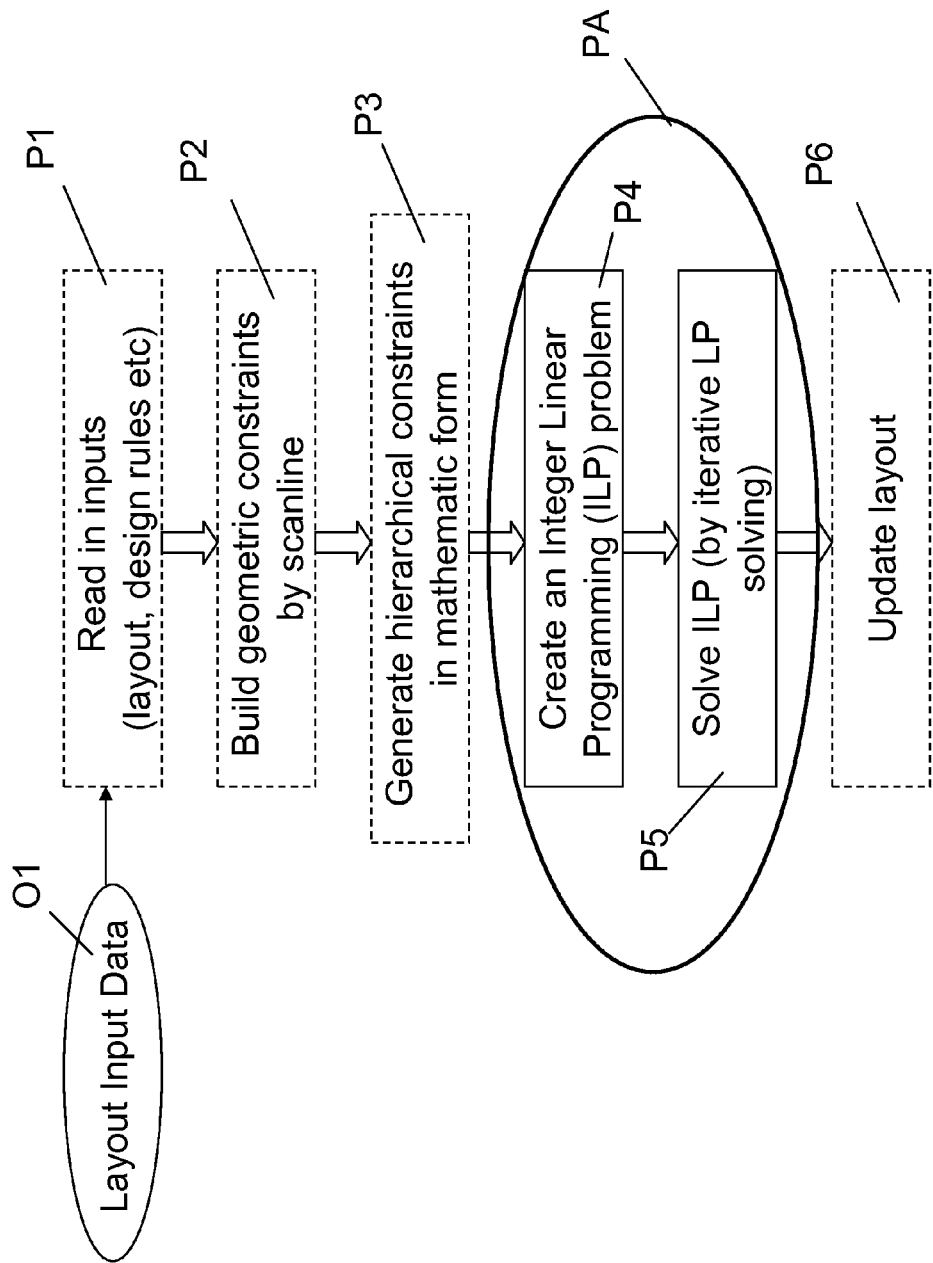
FIG. 1 shows a flow chart illustrating processes in a method according to embodiments.

The subject matter disclosed herein relates to solutions for solving integrated circuit layout optimization. Specifically, aspects of the invention relate to a parallel solving approach to layout optimization.

In large-scale integrated circuit layout design, layout migration and design for manufacturability (DFM) optimization are conventionally employed. In many cases, long runtime becomes an issue in solving layout migration and DFM optimization in these large-scale layouts. Specifically, the linear programming (LP) process associated with layout migration and DFM optimization can be time consuming.

In one general aspect of the invention, a method of optimizing an integrated circuit layout for implementation in an integrated circuit includes using hierarchical layout constraints in mathematical form to create an integer linear programming (ILP) problem, and then solve that ILP problem using an iterative method. It is understood that as used herein, the terms "layout" or "integrated circuit layout" may refer to a representation of an physical integrated circuit, including e.g., lines, vias, devices, etc. The layouts described herein can be implemented in the manufacture of physical integrated circuits, or components thereof, to form tangible circuitry or devices. As noted herein, aspects of the disclosure provide for analysis and modification of integrated circuit layouts, however, it is understood that these layouts will be used to form tangible devices according to the layout designs.

A first aspect includes a computer-implemented method for optimizing an integrated circuit layout, the method including: obtaining a plurality of hierarchical constraints in mathematical form, the plurality of hierarchical constraints defining a first integrated circuit layout; partitioning the plurality of hierarchical constraints into groups according to one or more partitioning rules; determining whether a boundary condition exists between two of the groups, and distributing a slack or a gap between the two of the groups in the case that the boundary condition exists; creating a plurality of integer linear programming problems associated with each of the groups; determining a solution for each of the plurality of integer linear programming problems; and integrating each solution together to form a second integrated circuit layout.

In a more specific aspect of the invention, the method includes:

A) Partitioning the hierarchical constraints into groups according to one or more partitioning rules;

B) Determining whether a boundary condition exists between two of the groups, and distributing a slack or a gap between the two of the groups in the case that the boundary condition exists;

C) Creating a plurality of sub-ILP problems, where each problem is associated with a distinct group;

D) Solving the plurality of sub-ILP problems; and

E) Integrating the results of the solutions. In some cases, integration can require that boundary conditions be resolved, which can include adjusting slacks/gaps, and/or re-solving of one or more sub-ILP problems according to the adjustment.

It is understood that any values used herein are for illustrative purposes only, and that these values are merely intended to facilitate understanding of the subject matter disclosed. These values should not be considered limiting of the disclosure.

Turning to FIG. 1, a flow chart illustrating processes in a method according to aspects of the invention is shown. As shown (e.g., in phantom) and described, some processes are indicated as either preliminary or subsequent to the method disclosed herein. While these processes may be part of an overall approach involving aspects of the invention, these processes may be performed separately from the method described herein.

For example, in preliminary process P1, layout input data (shown as data object O1) may be read into a system for processing the input data (O1), where that input data includes information such as the layout of an integrated circuit and design rules for reaching certain parameters (e.g., spacing, dimensions etc.). After this layout data (O1) is read (e.g., by a computer system, described further herein), in preliminary process P2 a plurality of geometric constraints can be built using, e.g., a conventional scanline approach. As is known in the art, the scanline approach can allow for checking of design rules provided in the layout input data (O1), and generation of geometric constraints (e.g., shapes, spacings, dimensions, etc.) based upon those design rules. Following building of the geometric constraints in preliminary process P2, preliminary process P3 can include generating hierarchical constraints in mathematic form. That is, preliminary process P3 may include translating the geometric constraints generated in preliminary process P2 into mathematical constraints (e.g., values) representing one or more of the geometric constraints. Following preliminary process P3, general process PA can include general sub-processes P4 and P5, respectively, which can include creating an ILP problem based upon the mathematical-format hierarchical constraints (P4), and solving the ILP problem using partitioning and iterative solving (P5). Following process PA, a subsequent process P6 can include updating the integrated circuit layout based upon the solution to the ILP problem from process P5.

Figure 2:
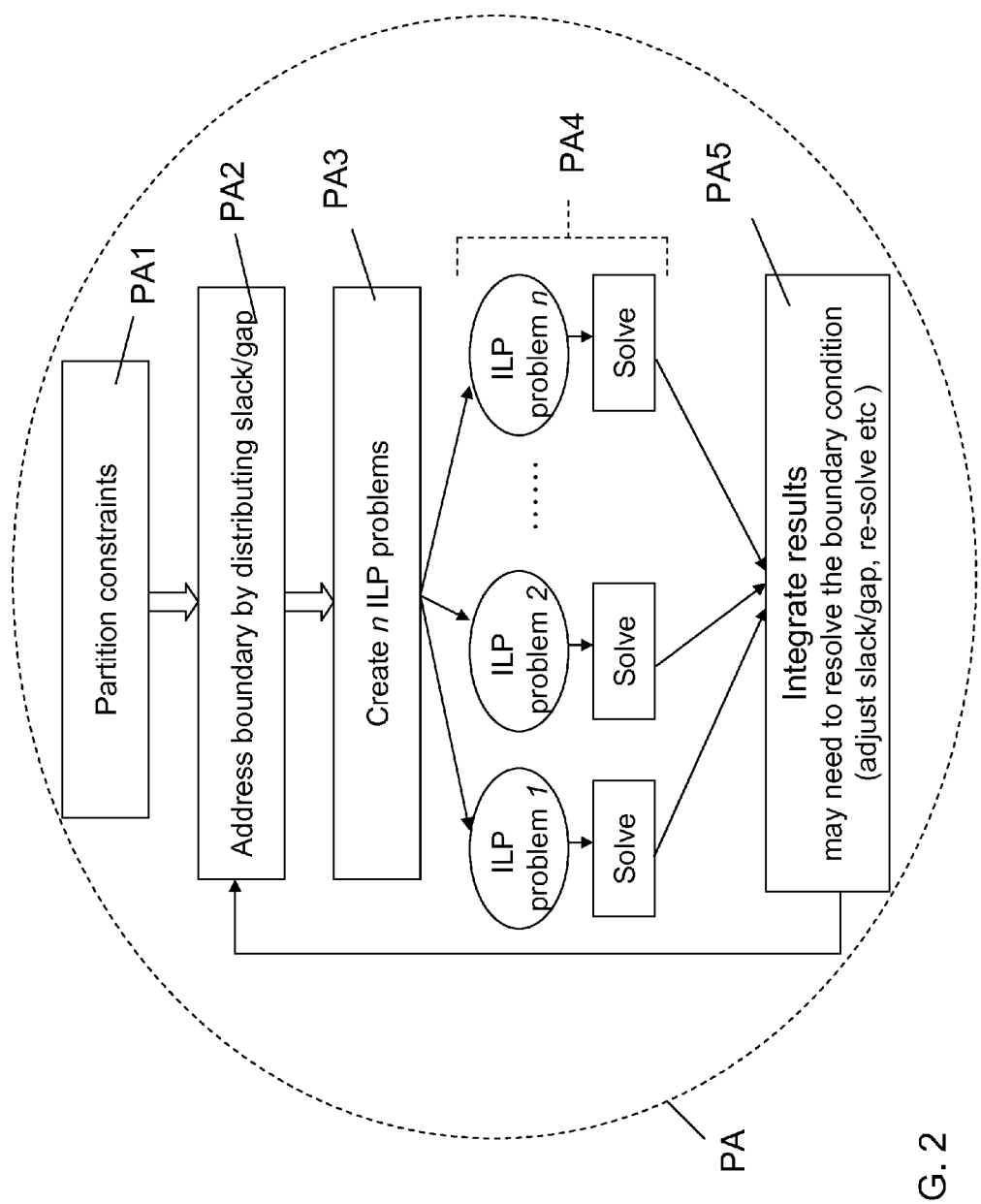
FIG. 2 shows a flow chart illustrating processes in a method according to embodiments.

General process PA will be explained in further detail using the other figures and descriptions herein. For example, turning to FIG. 2, general process PA is outlined as a series of sub-processes: PA1 through PA5.

In process PA1, the hierarchical constraints can be partitioned into groups according to one or more partitioning rules.

Following process PA1, in process PA2, at least one boundary condition between the groups can be addressed, by identifying whether a boundary condition exists between the groups, and by then distributing at least one of a slack or a gap along the at least one boundary where the boundary condition exists. As is known in the art, the term "slack" as used herein refers to the extra amount (or, value) of space available after the integrated circuit design rules or constraints are satisfied. That is, a slack may indicate that extra space is available to meet a particular design rule or constraint that is satisfied. In contrast, a "gap" as used herein refers to the value of space needed to satisfy the design rules/constraints where a design rule/constraint is violated. That is, a gap may indicate the amount of additional space needed to meet a particular design rule or constraint in the case that the design rule or constraint is violated.

Following process PA2, in process PA3, a plurality of sub-ILP problems (1-n) can be created from each of the groups, where each group of sub-problems is associated with a distinct partitioned group.

Following process PA3, in process PA4, the plurality of sub-ILP problems (1-n) can be solved according to specific rules associated with each sub-ILP problem.

Following process PA4, in process PA5, the results of the solutions may be integrated into one global solution for the entire group of hierarchical constraints associated with the layout. In some cases, integration can require that boundary conditions be resolved, which can include adjusting slacks/gaps, and/or re-solving of one or more sub-ILP problems according the adjustment.

In any case, as described herein, aspects of the invention may provide for solutions configured to perform parallel optimization of an integrated circuit layout is provided. In one exemplary embodiment, a computer-implemented method for optimizing an integrated circuit layout, the method comprising: obtaining a plurality of hierarchical constraints in mathematical form, the plurality of hierarchical constraints defining a first integrated circuit layout; partitioning the plurality of hierarchical constraints into groups according to one or more partitioning rules; determining whether a boundary condition exists between two of the groups, and distributing a slack or a gap between the two of the groups in the case that the boundary condition exists; creating a plurality of integer linear programming problems associated with each of the groups; determining a solution for each of the plurality of integer linear programming problems; and integrating each solution together to form a second integrated circuit layout.

Figure 3:
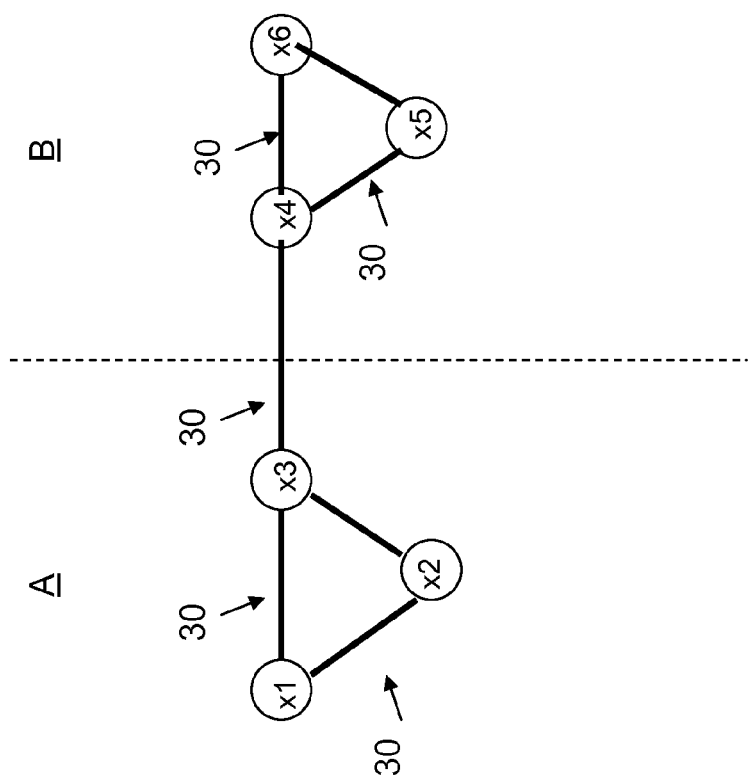
FIG. 3 shows an example of schematic partitioning of variables according to embodiments.

Turning to FIG. 3, an example of schematic partitioning of variables is shown according to embodiments. In this embodiment, a plurality of variables X1-X6 may be grouped according to constraints (e.g., 2-variable constraints). In this example, the following rules may be applied to variables: x2−x1≥10; x3−x2≥20; x1−x3≤40; x4−x3≥60; x5+x4≥100; x6−x4≥20; and x5+x6≥120. In this case, variables may be represented as nodes (e.g., x1-x6), and constraints may be represented as arcs 30. One particular partitioning rule, in the example of FIG. 3, is to partition the variables while minimizing the number of inter-cluster arcs 30 (or, constraints). That is, in this example, variables can be partitioned in such a way as to reduce the number of constraints spanning across boundaries. As shown in this example, groups of variables (A and B) have been generated, while leaving only one arc 30 (constraint) spanning between the two groups. In some cases, one or more arcs 30 may be assigned a cost value, and a goal of grouping may be to reduce the cost of inter-cluster arcs 30. In some cases, each cluster (or group, e.g., A and B) may be a sub-graph or sub-cluster, that can be sub-divided, if necessary, in order to optimize the solution for the constraints and/or variables in that sub-cluster.

It is understood that constraints may be partitioned into clusters in a number of ways, several of which are described herein. For example partitioning may be performed according to the following process:

PC1) Classify constraints into two categories: a) critical constraints; and b) non-critical constraints. Critical constraints can include equal constraints that must be maintained all of the time (e.g., equal spacings), violations, or objective (or infeasible) constraints. Non-critical constraints can include feasible constraints having slacks (e.g., those allowing for "white" or free space for fixing other violations in the layout).

PC2) Form preliminary partitions dividing constraints such that "white" or free space is located proximate the boundaries between clusters, and critical constraints are located within a single cluster (wherever possible). The preliminary partitions can aim to minimize the number of critical inter-cluster constraints. Within the partitioning process, costs may be assigned to each constraint (represented as arcs in the cluster diagrams), where critical constraints have a higher cost, and non-critical constraints have a lower cost. After assigning costs, inter-cluster arcs (or, constraints) may be minimized according to their assigned costs.

PC3) Partition clusters according to one or more conventional partitioning algorithms, e.g., a Fiduccia and Mattheyses (FM) partitioning algorithm, a hierarchical partitioning algorithm, and/or a network-flow-based partitioning algorithm.

Following partitioning of clusters, some boundary constraints may still exist (e.g., those arcs extending across distinct clusters). These boundary constraints can be addressed in the parallel solving method described herein. For example, in one case, the boundary constraints may be addressed by:

PB1) For each non-critical inter-cluster arc connecting nodes x1 and x2 (where x1 is in a cluster A and x2 is in a cluster B)—(i) distribute the slack to each node, e.g., where x2−x1≥100, the initial value of x2=200, and the initial value of x1=60; the slack may be calculated as 200−60−100=40; and (ii) following slack calculation, removing the constraint to evenly distribute the slack to the constraint: adding x2≥180 to cluster A, adding x1≤80 to cluster B;

PB2) Distribute the objective gap to two critical nodes—(i) x6−x5≥100, where x6=200 and x5=120, initially; (ii) impose objective of x6≥210; x5≤110;

PB3) Examine fan-in and fan-out of x1 and x2 (1 constraint jump) via local search to determine how to distribute slack/gap;

PB4) Fix boundary constraints for each sub-problem; and

PB5) Solve the sub-problems via parallel solving approach.

Subsequent to PB5, the boundary conditions may be re-adjusted. That is, in the first "pass" (PB1-PB5), the slacks/gaps are distributed to sub-problems, and the boundary constraints can be resolved when solving each sub-problem. However, in some cases, one or more sub-problems (e.g., subA, subB, etc.) may not utilize all of the allocated slack, or fill all of the allocated gap. In these cases, the distribution of slacks/gaps may be reallocated, and additional analysis may be performed. For example, the following type of re-adjustment could occur:

First pass: x2−x1≥100, is partitioned to cluster A: x2≥180, and cluster B: x1≤80; after parallel solving (P5B), x2=180, x1=60; Readjust such that adjusted cluster A: x2≥160, and cluster B: x1≤60, and perform second pass (e.g., repeat parallel solving such as P5B for adjusted cluster).

Figure 4:
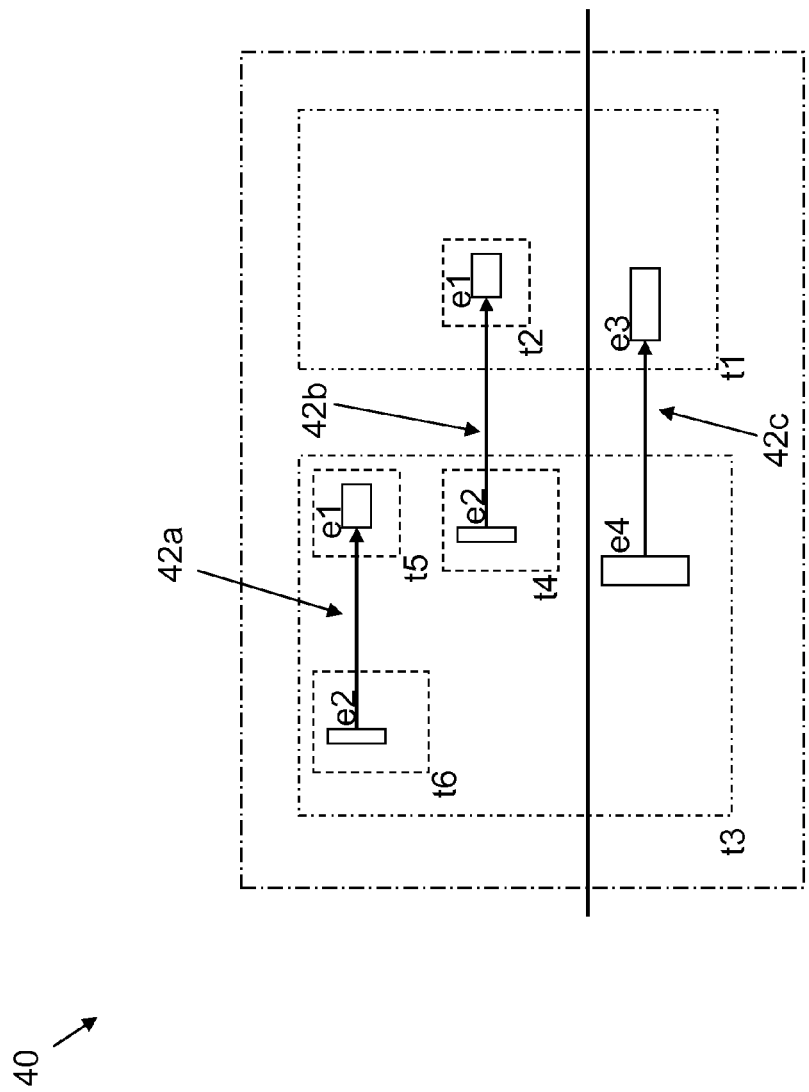
FIG. 4 shows an illustrative mathematical multi-variable layout according to embodiments.
Figure 5:
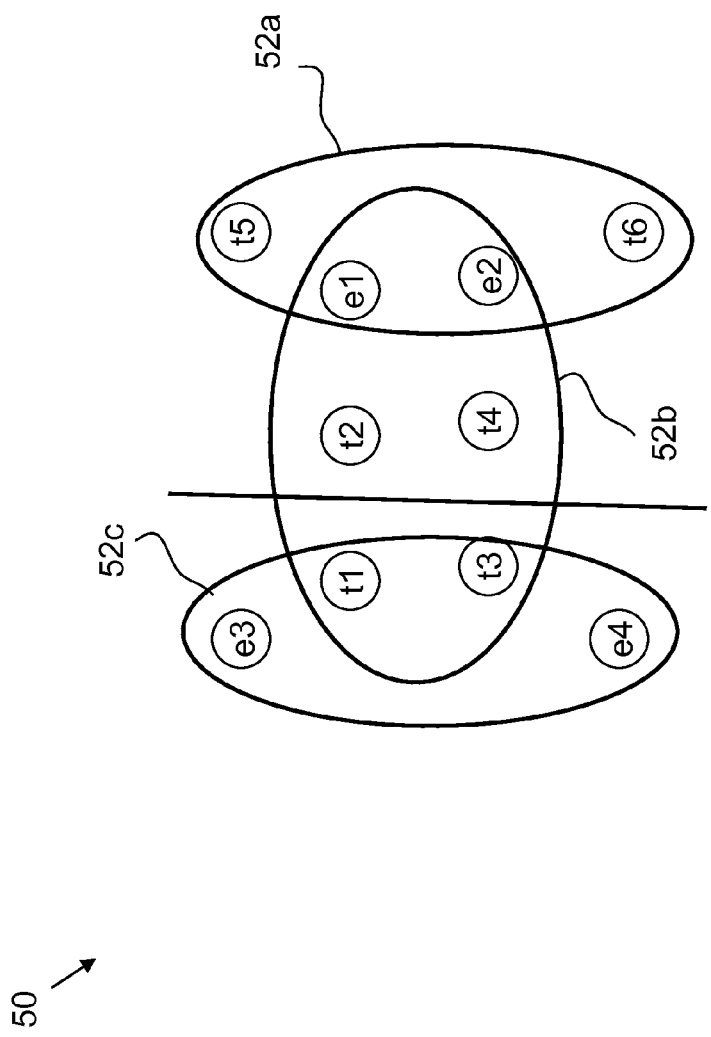
FIG. 5 shows a corresponding graphical depiction of the layout of FIG. 4.

Turning to FIGS. 4-5, an illustrative mathematical multi-variable layout, and a corresponding graphical depiction of that layout, are shown, respectively according to one example. In the example of FIGS. 4-5, the following rules may be applied:

For an inter-cluster arc: split the inter-cluster arc into two by distributing slack/gap. Where the initial value of $(t1^{old}+t2^{old}+e1^{old})-(t3^{old}+t4^{old}+e2^{old})=12$; with slack of 2 (12−10=2); $t1^{old}-t3^{old}=4$; and $t2^{old}+e1^{old}-t4^{old}-e2^{old}=8$.

After dividing the inter-cluster arc, the following rules may dictate the mathematical multi-variable layout:

$$(t1+t2+e1)-(t3+t4+e2) \geq 10;$$

$$(t1+e3)-(t3+e4) \geq 5; \text{ and}$$

$$(t5+e1)-(t6+e2) \geq 6.$$

Turning to FIG. 4, the mathematical multi-variable layout 40 is shown including a plurality of multi-variable constraints 42 (represented as arrows, 42a, 42b, 42c). This mathematical layout 40 illustrates multi-variable constraints 42 connecting variables (e1, e2, e3, etc.) within designated timing groupings or timing clusters (t1, t2, t2, etc.). As shown, the following rules apply:

$$t1-t3 \geq 3 \text{(initial value is 4); and}$$

$$(t1+e3)-(t3+e4) \geq 5.$$

FIG. 5 shows a graphical depiction 50 of the example layout 40 of FIG. 4, where the multi-variable constraints (e.g., multi-variable constraints 42, FIG. 4) are represented as hyper-arcs (e.g., arcs connecting n nodes) 52a, 52b, 52c, corresponding to the multi-variable constraints 42a, 42b, 42c of FIG. 4, respectively. As shown, the following rules apply:

$$t2+e1-t4-e2 \geq 7 \text{(initial value is 8); and}$$

$$(t5+e1)-(t6+e2) \geq 6.$$

For each integer linear programming (LP) problem, it is also possible to further partition sub-problems (or sub-clusters) purely based on the relaxed LP problem. This may include:

RLP1) Building a graph based upon the relaxed LP problem;

RLP2) Partitioning the graph into sub-LP problems (e.g., into subLP1, subLP2, . . . subLPn);

RLP3) Ignoring inter-cluster LP constraints, and solving each subLP in parallel;

RLP4) After solving all subLPs, integrating the solved subLPs and incrementally re-solving each integrated group (as some inter-cluster LP constraints may be violated);

RLP5) Integrating a final grouping of the subLPs and solving that integration (e.g., via a conventional simplex method).

Figure 6:
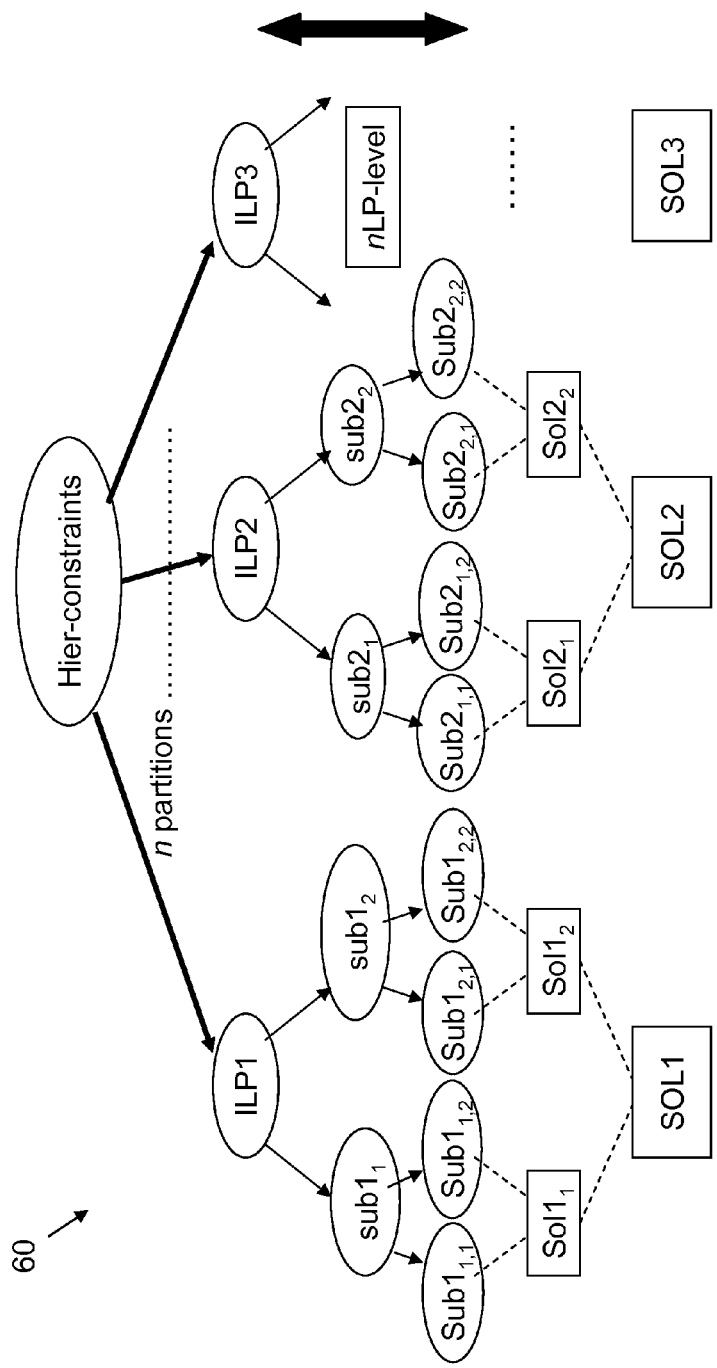
FIG. 6 shows a schematic flow diagram illustrating resolution of a plurality of hierarchical constraints according to embodiments.

FIG. 6 shows a schematic flow diagram 60 illustrating resolution of a plurality of hierarchical constraints (or, Hier-constraints, or simply, constraints), partitioned according to one or more rules described herein. As shown, the constraints may be divided into n partitions, forming integer linear programming (ILP) groups ILP1, ILP2, ILP3, etc. Each of those ILPs may be divided into sub-ILPs, or generic sub-groups $SubA_a$, $SubA_b$, etc. (e.g., 2 shown per ILP, $Sub1_1$, $Sub1_2$). Additionally, those sub-ILPs may be further sub-divided, and solved, e.g., to come to solutions ($SolA_a$, $SolA_b$, etc.). These solutions may be then grouped to form ILP solutions, which then may be joined to solve the constraints.

Figure 7:
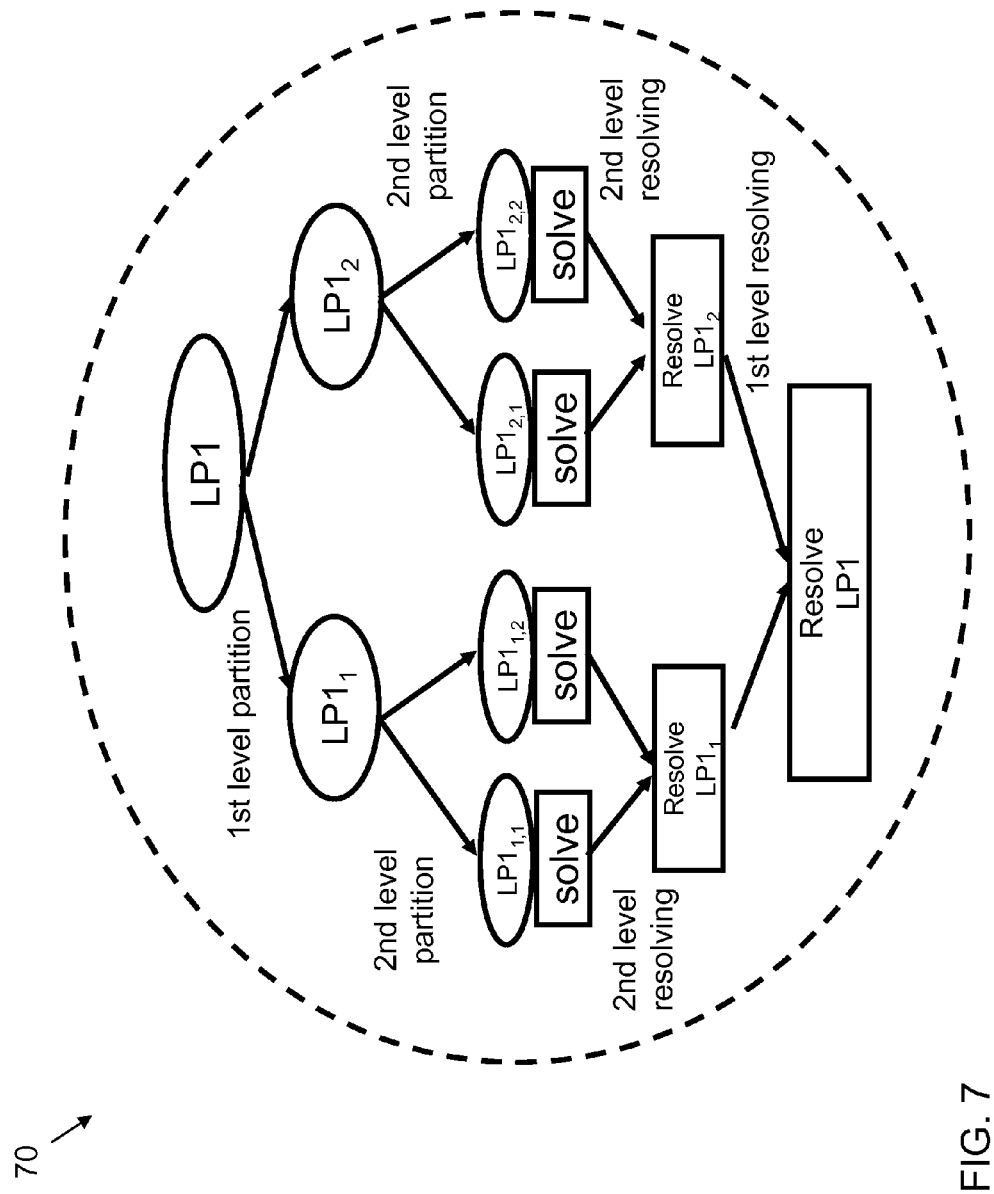
FIG. 7 shows a schematic flow diagram illustrating the partitioning and solving of an LP problem according to embodiments.
Figure 8:
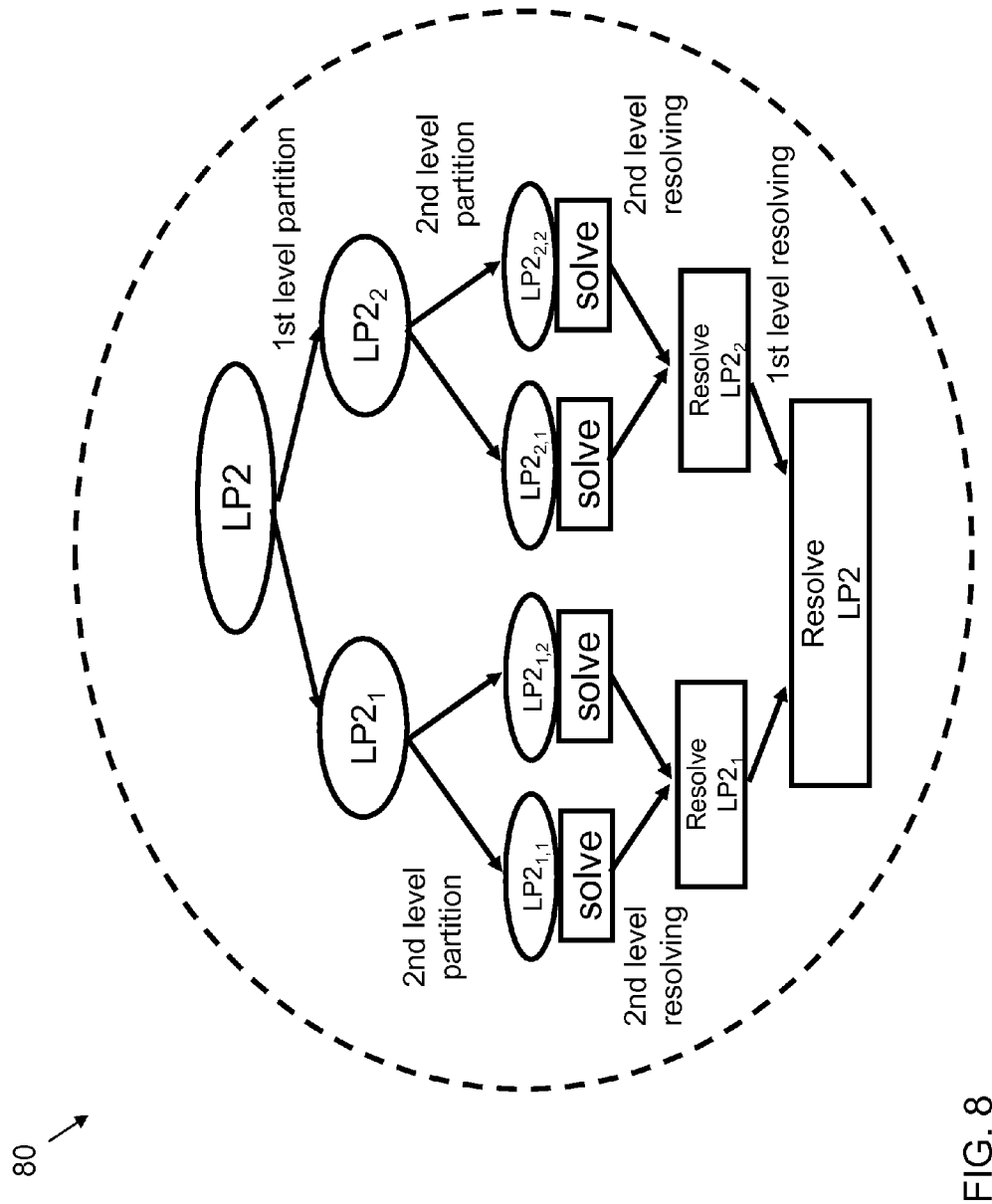
FIG. 8 shows a schematic flow diagram illustrating the partitioning and solving of an LP problem according to embodiments.

FIGS. 7-8 show schematic flow diagrams 70, 80, respectively illustrating the partitioning and solving of separate LP problems (LP1 and LP2, respectively) according to aspects. It is understood that these LP problems are relaxed versions of the Integer Linear Programming (ILP) problems, where It should be noted that in aspects, partitioning to form the LP1 and LP2 problems does not result in a quality loss in solving those respective problems. As shown in FIG. 7, LP1 may be partitioned into two sub-LP problems ($LP1_1$ and $LP1_2$), and if necessary, each of the sub-LP problems may be further partitioned ($LP1_1$ is further partitioned to $LP1_{1,1}$ and $LP1_{1,2}$, $LP1_2$ is partitioned to $LP1_{2,1}$ and $LP1_{2,2}$). Each of those sub-sub LP problems may be solved, and those solutions may be integrated and resolved to form a solution to LP1. Similarly, in FIG. 8, the LP 2 may be partitioned into two sub-LP problems ($LP2_1$ and $LP2_2$), and if necessary, each of the sub-LP problems may be further partitioned ($LP2_1$ is further partitioned to $LP2_{1,1}$ and $LP2_{1,2}$, $LP2_2$ is further partitioned to $LP2_{2,1}$ and $LP2_{2,2}$). Each of those sub-sub LP problems may be solved, and those solutions may be integrated and resolved to form a solution to LP2.

It is understood that in optimizing for design-for-manufacturability (DFM) (e.g., such as via optimization, double via insertion, fixing minimum areas, fixing short edge rules, etc.), a small portion of the layout can be modified, and that modification may be relatively local. As such, these DFM problems can be amenable to the partitioning solutions described herein. After effective partitioning according to the solutions described herein, boundary constraints between sub-problems can be minimized, allowing for solution of each sub-problem independently. Due to the effectiveness of the partitioning and allocation of boundary conditions, the sub-problem solutions can be integrated without a quality loss in the overall solution. Aspects described herein may therefore reduce the solving time for these layout optimization problems, and in particular, may aid in reducing the long run time of solving linear programming problems in layout optimization.

Figure 9:
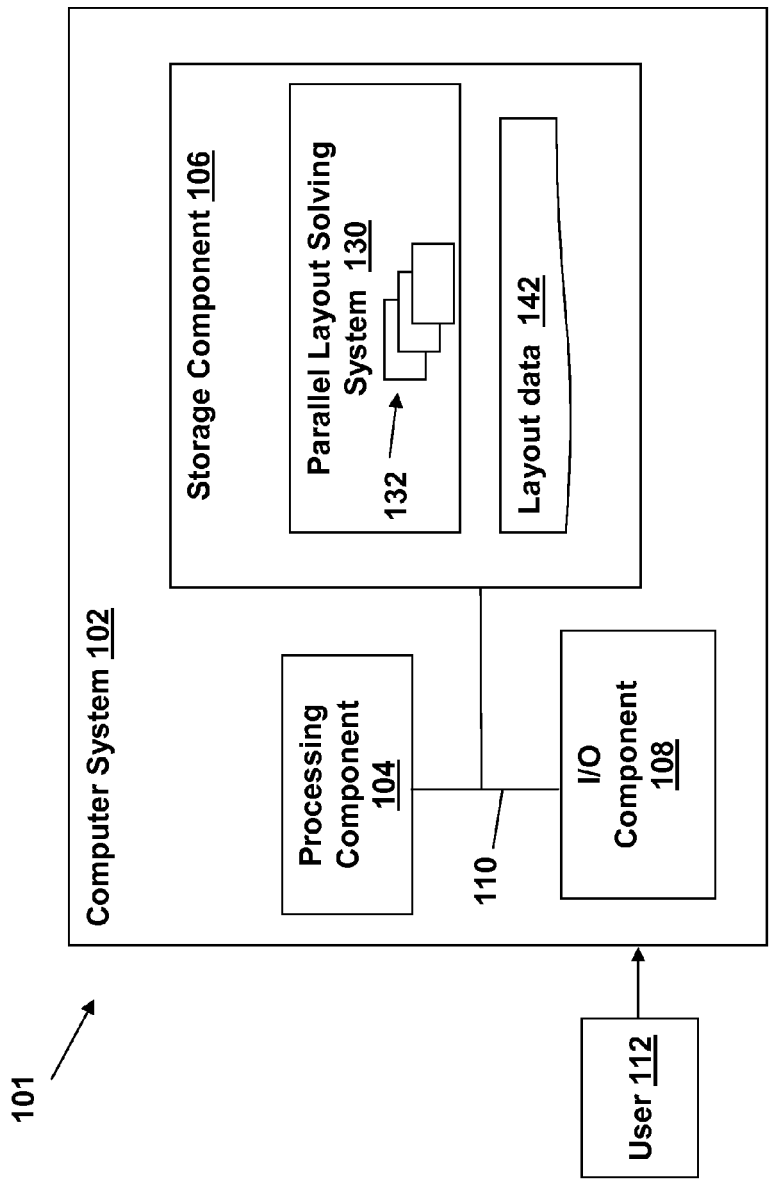
FIG. 9 depicts an illustrative environment for parallel integrated circuit layout solving according to an embodiment It is noted that the drawings of the invention are not necessarily to scale. The drawings are intended to depict only typical aspects of the invention, and therefore should not be considered as limiting the scope of the invention. In the drawings, like numbering represents like elements between the drawings.

FIG. 9 depicts an illustrative environment 101 for parallel solving of integrated circuit layout optimization according to an embodiment. To this extent, the environment 101 includes a computer system 102 that can perform a process described herein in order to integrate manufacturing feedback into an integrated circuit structure design. In particular, the computer system 102 is shown as including a parallel layout solving system 130, which makes computer system 102 operable to handle integrating manufacturing feedback into an integrated circuit structure design by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the parallel layout solving system 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the parallel layout solving system 130 can manage a set of interfaces (e.g., graphical user interface(s), application program interface, etc.) that enable human and/or system users 112 to interact with the parallel layout solving system 130. Further, the parallel layout solving system 130 can manage (e.g., store, retrieve, create, manipulate, organize, present, etc.) data, such as layout data 142 using any solution.

In any event, the computer system 102 can comprise one or more general purpose computing articles of manufacture (e.g., computing devices) capable of executing program code, such as the parallel layout solving system 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the parallel layout solving system 130 can be embodied as any combination of system software and/or application software.

Further, the parallel layout solving system 130 can be implemented using a set of modules 132. In this case, a module 132 can enable the computer system 102 to perform a set of tasks used by the parallel layout solving system 130, and can be separately developed and/or implemented apart from other portions of the parallel layout solving system 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of parallel layout solving system 130 fixed thereon (e.g., one or more modules 132). However, it is understood that the computer system 102 and parallel layout solving system 130 are only representative of various possible equivalent computer systems that may perform a process described herein. To this extent, in other embodiments, the functionality provided by the computer system 102 and parallel layout solving system 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as layout data 142 using any solution. For example, the computer system 102 can generate and/or be used to layout data 142, retrieve layout data 142, from one or more data stores, receive layout data 142, from another system, send layout data 142 to another system, etc.

While shown and described herein as a method and system for integrating manufacturing feedback into an integrated circuit design, it is understood that aspects of the invention further provide various alternative embodiments. For example, in one embodiment, the invention provides a computer program fixed in at least one computer-readable medium, which when executed, enables a computer system to determine a lithographic set point. To this extent, the computer-readable medium includes program code, such as the parallel layout solving system 130 (FIG. 9), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the parallel layout solving system 130 (FIG. 9), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for correcting a mask deviation. In this case, a computer system, such as the computer system 102 (FIG. 9), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computer-implemented method for optimizing an integrated circuit layout for implementation in an integrated circuit performed using at least one computing device, the method comprising:

obtaining a plurality of hierarchical constraints in mathematical form, the plurality of hierarchical constraints defining a first integrated circuit layout;

partitioning the plurality of hierarchical constraints into groups according to one or more partitioning rules, using the at least one computing device;

identifying a boundary condition between two of the groups, and distributing a slack or a gap between the two of the groups in response to identifying the boundary condition;

creating a plurality of integer linear programming problems associated with each of the plurality of hierarchical constraint groups;

determining a solution for each of the plurality of integer linear programming problems according to specific rules associated with each of the plurality of integer linear programming problems;

redistributing the slack or the gap based on the determined solution for each of the plurality of integer linear programming problems; and integrating each solution for each of the plurality of integer linear programming problems together to form a second integrated circuit layout, using the at least one computing device, wherein the integrating is performed only after the redistributing of the slack or the gap.

2. The computer-implemented method of claim 1, further comprising determining whether to distribute the slack or the gap between the two of the groups in response to identifying the boundary condition.

3. The computer-implemented method of claim 1, wherein the distributing includes at least one of: adjusting the slack associated with the boundary condition or adjusting the gap associated with the boundary condition.

4. The computer-implemented method of claim 1, further comprising determining a second solution to the each of the plurality of integer linear programming problems according to the redistributing of the slack or the redistributing of the gap, after the determining of the solution to the each of the plurality of integer linear programming problems.

5. The computer-implemented method of claim 1, further comprising:

obtaining layout data about an integrated circuit design;

building a plurality of geometric constraints based upon the layout data; and generating the hierarchical constraints in mathematical form based upon the geometric constraints, before the obtaining of the plurality of hierarchical constraints in mathematical form.

6. The computer-implemented method of claim 1, wherein the one or more partitioning rules includes partitioning the plurality of hierarchical constraints to minimize a number of inter-cluster arcs between the groups, wherein each arc is assigned a cost, and the partitioning rule includes minimizing a total cost of the inter-cluster arcs.

7. The computer-implemented method of claim 1, wherein the partitioning includes:

classifying the plurality of hierarchical constraints into two categories consisting of critical constraints and non-critical constraints;

assigning a cost to each of the plurality of hierarchical constraints, wherein the critical constraints are assigned a higher cost than non-critical constraints; and partitioning the plurality of hierarchical constraints into the groups to minimize a number of inter-cluster arcs between the groups, wherein the partitioning rule includes minimizing a total cost of the inter-cluster arcs.

8. A system comprising:

at least one computing device configured to optimize an integrated circuit layout for implementation in an integrated circuit by performing actions including:

obtaining a plurality of hierarchical constraints in mathematical form, the plurality of hierarchical constraints defining a first integrated circuit layout;

partitioning the plurality of hierarchical constraints into groups according to one or more partitioning rules;

determining whether a boundary condition exists between two of the groups, and distributing a slack or a gap between the two of the groups in the case that the boundary condition exists;

creating a plurality of integer linear programming problems associated with each of the groups;

determining a solution for each of the plurality of integer linear programming problems; and integrating each solution together to form a second integrated circuit layout.

9. The system of claim 8, further comprising determining whether to distribute the slack or the gap between the two of the groups in the case that the boundary condition exists.

10. The system of claim 8, wherein the distributing includes at least one of: adjusting a slack associated with the boundary condition or adjusting a gap associated with the boundary condition.

11. The system of claim 8, further comprising redistributing the slack or the gap based on the determined solution for each of the plurality of integer linear programming problems.

12. The system of claim 11, the actions further comprising determining a second solution to the each of the plurality of integer linear programming problems according to the redistributing of the slack or the redistributing of the gap, after the determining of the solution to the each of the plurality of integer linear programming problems.

13. The system of claim 8, the actions further comprising: obtaining layout data about an integrated circuit design.

14. The system of claim 13, the actions further comprising building a plurality of geometric constraints based upon the layout data; and generating the hierarchical constraints in mathematical form based upon the geometric constraints, before the obtaining of the plurality of hierarchical constraints in mathematical form.

15. A computer program product comprising program code embodied in at least one non-transitory computer-readable medium, which when executed, enables a computer system to optimize an integrated circuit layout for implementation in an integrated circuit by performing actions comprising:

obtaining a plurality of hierarchical constraints in mathematical form, the plurality of hierarchical constraints defining a first integrated circuit layout;

partitioning the plurality of hierarchical constraints into groups according to one or more partitioning rules;

determining whether a boundary condition exists between two of the groups, and distributing a slack or a gap between the two of the groups in the case that the boundary condition exists;

creating a plurality of integer linear programming problems associated with each of the groups;

determining a solution for each of the plurality of integer linear programming problems; and integrating each solution together to form a second integrated circuit layout.

16. The computer program product of claim 15, further comprising determining whether to distribute the slack or the gap between the two of the groups in the case that the boundary condition exists.

17. The computer program of product claim 15, wherein the distributing includes at least one of: adjusting the slack associated with the boundary condition or adjusting the gap associated with the boundary condition.

18. The computer program product of claim 15, further comprising redistributing the slack or the gap based on the determined solution for each of the plurality of integer linear programming problems.

19. The computer program product of claim 18, further comprising determining a second solution to the each of the plurality of integer linear programming problems according to the redistributing of the slack or the redistributing of the gap, after the determining of the solution to the each of the plurality of integer linear programming problems.

20. The computer program product of claim 15, further comprising: obtaining layout data about an integrated circuit design.

* * * * *